United States Patent
Wong et al.

(10) Patent No.: US 8,253,432 B2
(45) Date of Patent: Aug. 28, 2012

(54) FORK ASSEMBLY FOR PROTECTION CIRCUIT OF TEST SYSTEM

(75) Inventors: Kwo-Jyr Wong, Taipei Hsien (TW); Chih-Yung Yuan, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 343 days.

(21) Appl. No.: 12/690,238

(22) Filed: Jan. 20, 2010

(65) Prior Publication Data

US 2011/0095775 A1  Apr. 28, 2011

(30) Foreign Application Priority Data

Oct. 28, 2009 (CN) ............... 2009 2 0313459

(51) Int. Cl.
*G01R 31/26* (2006.01)
(52) U.S. Cl. ............... 324/762.01; 439/188; 439/101; 439/102; 361/52; 361/42
(58) Field of Classification Search ............ 439/96, 439/101, 102, 106, 45, 46, 508, 569; 361/52
See application file for complete search history.

(56) References Cited

U.S. PATENT DOCUMENTS

| | | | | |
|---|---|---|---|---|
| 4,438,303 A * | 3/1984 | Astier | | 200/51.1 |
| 4,952,758 A * | 8/1990 | Dara et al. | | 200/51.09 |
| 6,422,902 B1 * | 7/2002 | Ogren et al. | | 439/668 |
| 7,021,950 B2 * | 4/2006 | Borrego Bel et al. | | 439/181 |
| 7,128,591 B2 * | 10/2006 | Tsai | | 439/188 |
| 7,626,131 B1 * | 12/2009 | Gibboney, Jr. | | 200/51.1 |

* cited by examiner

*Primary Examiner* — Richard Isla Rodas
(74) *Attorney, Agent, or Firm* — Altis Law Group, Inc.

(57) ABSTRACT

A fork assembly includes a fixed board, a ground portion, a trigger portion, a switch and a resilient element. The ground portion includes a first arm and a second arm located opposite to the first arm, one end of each of the first arm and the second arm is connected to the fixed board, and the other end is free. The trigger portion includes a third arm and a fourth arm located opposite to the third arm, one end of each of the third arm and the fourth arm is connected to the fixed board. The switch is fixed on the other end of the third arm, and includes a normally open contact. The resilient element is configured on the other end of the fourth arm and corresponding to the normally open contact of the switch. The first, second, third and forth arms are conductively and resiliently connected together.

10 Claims, 5 Drawing Sheets

FORK ASSEMBLY FOR PROTECTION CIRCUIT OF TEST SYSTEM

BACKGROUND

1. Technical Field

The disclosure generally relates to test systems, and more particularly to a protection circuit for a test system.

2. Description of Related Art

An enclosure of a communication product is generally grounded during testing to ensure safety of electrical parts and/or test operators. FIG. 5 is a schematic diagram of a commonly used test system 10. The test system 10 comprises a device under test (DUT) 11 and a power transformer box 12 providing suitable electrical signals to the DUT 11. The DUT 11 includes an enclosure 110 with circuits 111, and a socket 112. The power transformer box 12 transforms direct-current (DC) signals to the DUT 11. A plug 13 is connected to the power transformer box 12 via a ground wire 14 and is adapted to be inserted into the socket 112 in the enclosure 110 to ensure the enclosure 110 of the DUT 11 is grounded during testing.

The commonly used test system 10 may be dangerous, to some extent. That is, if when the tested circuits 111 are connected to the power transformer box 12, the plug 13 is not inserted into the socket 112 of the enclosure 11, and/or the plug 13 is pulled out from the socket 112 of the enclosure 11 before the tested circuits 111 are disconnected from the power transformer box 12, due to a mistake of the test operators. The mistake could result in damage to the DUT 11, and injury to an operator if the DUT 11 is not grounded.

Therefore, a need exists in the industry to overcome the described limitations.

DETAILED DESCRIPTION

Figure 1:
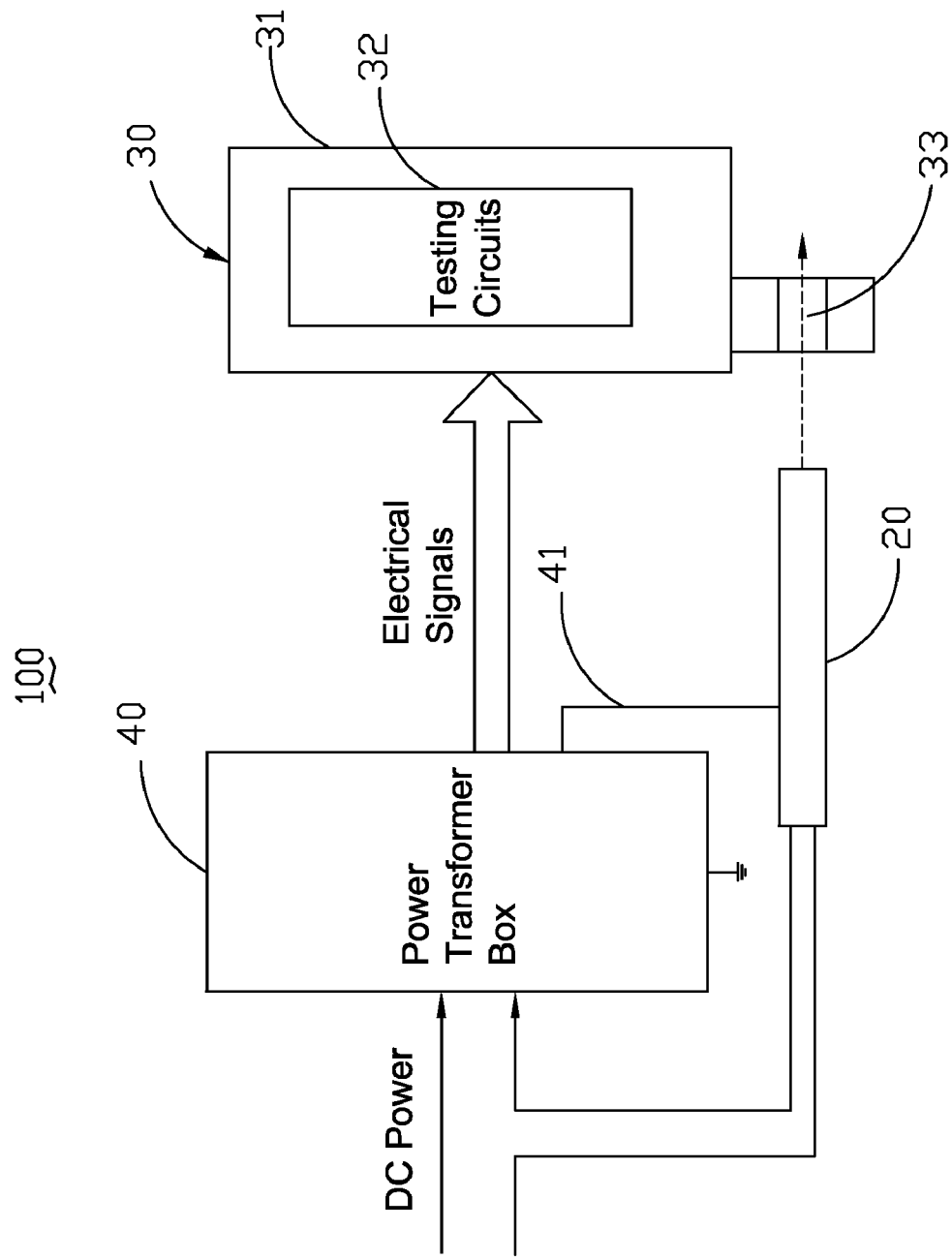
FIG. 1 is a schematic diagram of one embodiment of a test system of the disclosure.

FIG. 1 is a schematic diagram of one embodiment of a test system 100 of the disclosure. The test system 100 comprises a device under test (DUT) 30 and a power transformer box 40 to transform direct current (DC) power into suitable electrical signals to the DUT 30. The DUT 30 comprises an enclosure 31 and one or more circuits 32 received in the enclosure 31. In the enclosure 31, a socket 33 is defined for grounding. A fork assembly 20 is connected to the DC power to control input of the power transformer box 40. A ground wire 41, for example, connects to a grounded enclosure of the power transformer box 40, which grounds the fork assembly 20. In the embodiment, the fork assembly 20 is adapted to be inserted into the socket 33 to ensure the enclosure 31 is grounded before the power transformer box 40 supplies the electrical signals to the DUT 30.

Figure 2:
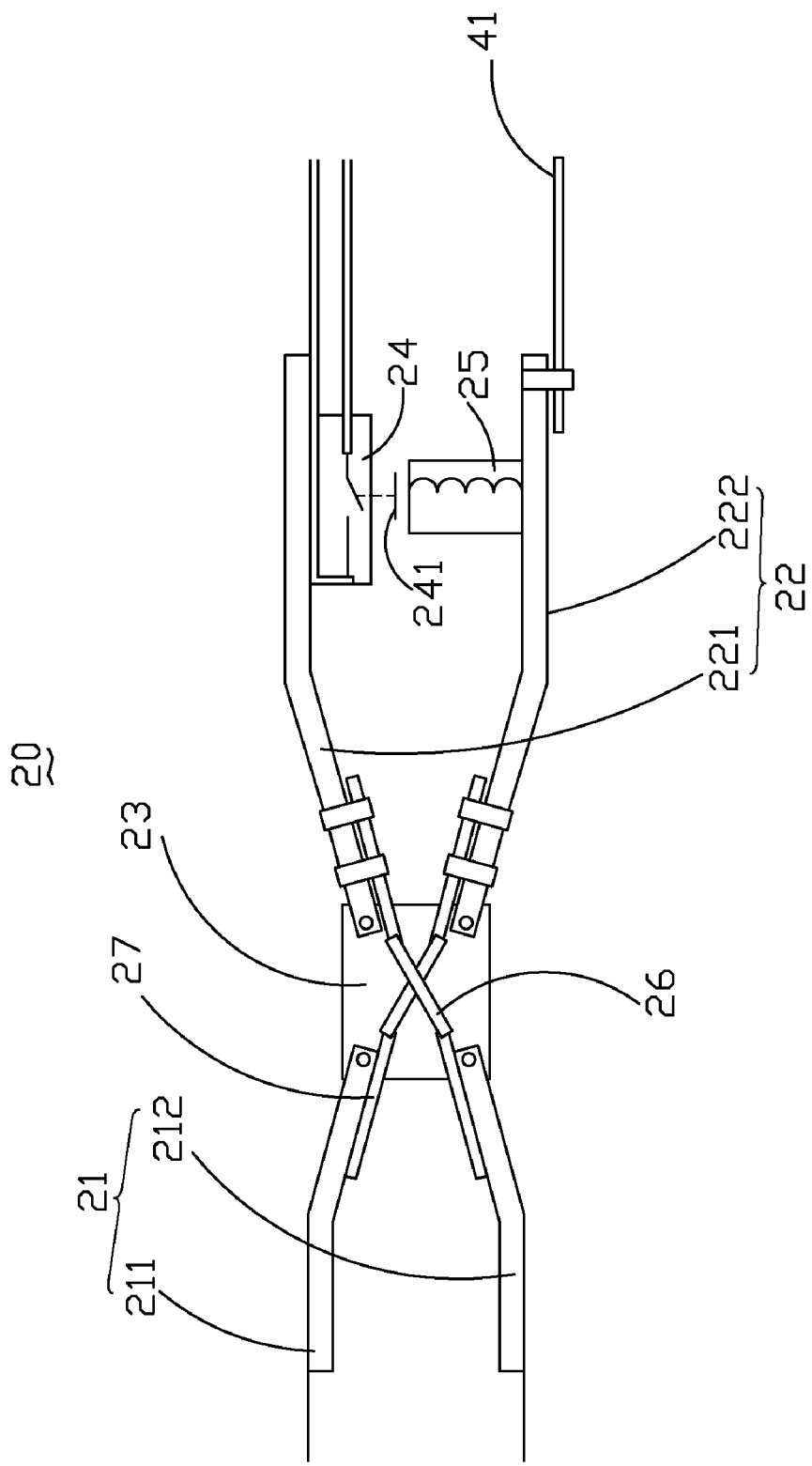
FIG. 2 is a schematic diagram of structure of a fork assembly of FIG. 1 in accordance with a first exemplary embodiment of the disclosure.

FIG. 2 is a schematic diagram of structure of the fork assembly 20 of FIG. 1 in accordance with a first exemplary embodiment of the disclosure. The fork assembly 20 comprises a ground portion 21, a trigger portion 22, a fixed board 23, a switch 24, a resilient element 25, a first spring shaft 26, and a second spring shaft 27.

The ground portion 21 comprises a first arm 211 and a second arm 212 located opposite to the first arm 211. One end of each of the first arm 211 and the second arm 212 is pivotally connected to the fixed board 23 and controlled by the first spring shaft 26 and the second spring shaft 27, and a second end of each of the first arm 211 and the second arm 212 is free.

The trigger portion 22 comprises a third arm 221 and a fourth arm 222 located opposite to the third arm 221. One end of each of the third arm 221 and the fourth arm 222 is pivotally connected to the fixed board 23 and also controlled by the first spring shaft 26 and the second spring shaft 27.

The switch 24 is fixed on the other end of the third arm 221, and comprises an normally open contact 241 connected to the DC power in series to control the input to the power transformer box 40. The resilient element 25 is configured on a second end of the fourth arm 222 and corresponds to the normally open contact 241 of the switch 24. When the third arm 221 and the fourth arm 222 are moved toward each other by external forces, the resilient element 25 presses the normally open contact 241 and finally triggers the switch 24 to the on position, so that the DC power is input to the power transformer box 40. The second end of the fourth arm 222 is grounded via the ground wire 41.

In the illustrated embodiment, the arms 211, 212, 221, 222 collectively form a substantially "X" shape configuration.

The first spring shaft 26 and the second spring shaft 27 are configured across the fixed board 23. One end of the first spring shaft 26 is connected to the one end of the second arm 212 to resiliently support the second arm 212, and the other end is fixed on the one end of the third arm 221. Similarly, one end of the second spring shaft 27 is connected to the one end of the first arm 211 to resiliently support the first arm 212, and the other end is fixed on the one end of the fourth arm 222. The first spring shaft 26 and the second spring shaft 27 are positioned to resiliently connect together the arms 211, 212, 221 and 222.

In the illustrated embodiment, the first arm 211, the second arm 212, the third arm 221, the fourth arm 222, the fixation board 23, the first spring shaft 26, and the second spring shaft 27 of the fork assembly 20 are all made of conductive metal, such as copper.

Figure 3:
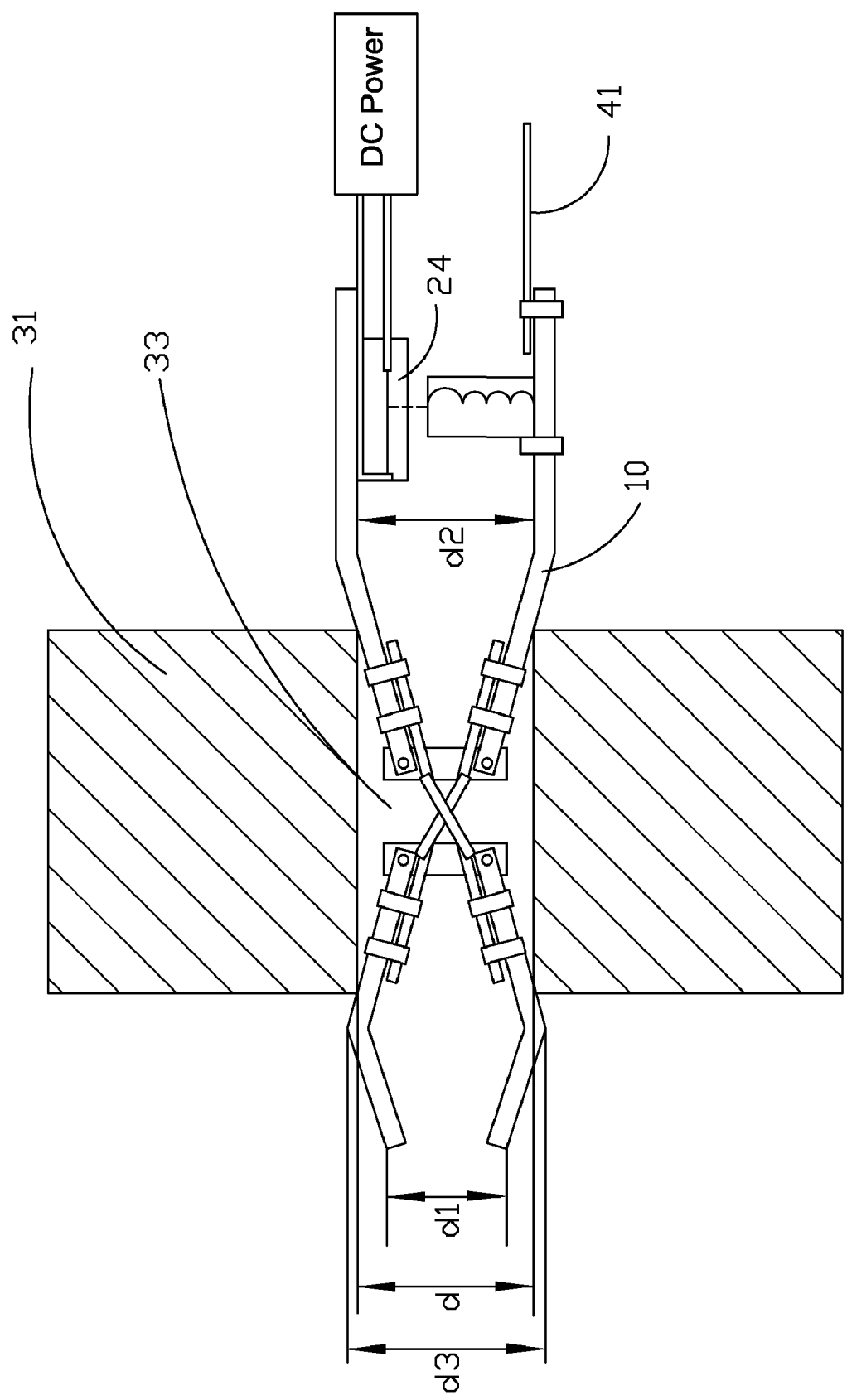
FIG. 3 is a schematic diagram of the fork assembly of FIG. 2 inserted into a socket in an enclosure of FIG. 1.

FIG. 3 is a schematic diagram of the fork assembly 20 of FIG. 2 inserted into the socket 33 in the enclosure 31 of the DUT 30. In the illustrated embodiment, a distance d1 between the free ends of the first arm 211 and the second arm 212 is less than an outer diameter "d" of the socket 33 in the enclosure 31 to allow the fork assembly 20 to be inserted into the socket 33 in the enclosure 31 easily. A maximal distance d2 between the third arm 221 and the fourth arm 222, and a maximal distance d3 between the first arm 211 and the second arm 212 are both larger than the outer diameter "d" of socket 33 in the enclosure 31, so as to prevent the fork assembly 20 breaking away from the socket 33 of the enclosure 31.

When testing the DUT 30, during a process of insertion of the fork assembly 20, the ground portion 21 of the fork assembly 20 is firstly inserted into the socket 33 in the enclosure 31. In this position, the enclosure 31 is grounded, but the trigger portion 22 of the fork assembly 20 is free. The switch 24 is still off. The power transformer box 40 cannot supply electricity to the DUT 11. Subsequently, the trigger portion 22 of the fork assembly 20 is inserted into the socket 33 with the third arm 221 and the fourth arm 222 moving toward each other under force of the first spring shaft 26 and the second spring shaft 27 until the resilient element 25 on the fourth arm 222 presses the normally open contact 241 of the switch 24 triggering the switch 24 to the on position. In this position, the DC power is input to the power transformer box 40, and the power transformer box 40 supplies the suitable electrical signals to the one or more tested circuits 32 in the enclosure 31.

As described above, the enclosure 31 of the DUT 30 is grounded when the ground portion 21 of the fork assembly 20 is inserted into the socket 33 of the enclosure 31, thus the DC power is input to the power transformer box 40 when the trigger portion 22 of the fork assembly 20 is inserted into the socket 33 in the enclosure 31. In this way the safety of the electrical parts in the enclosure 31 and test operators is ensured during testing.

When the fork assembly 20 is unplugged from the socket 33 in the enclosure 31 of the DUT 30, the trigger portion 22 of the fork assembly 20 is firstly moved away from the socket 33 of the enclosure 31 with the third arm 221 and the fourth arm 222 moving away from each other under the control of the first spring shaft 26 and the second spring shaft 27, the resilient element 25 moves away from the normally open contact 241 of the switch 24 to turn the switch off 24. In this position, the power transformer box 40 already fails to supply the electrical signals to the circuits 32 in the enclosure 31, but the enclosure 31 is still grounded until the ground portion 21 of the fork assembly 20 is pulled out from the socket 33 in the enclosure 31, which prevents the electrical parts in the enclosure 31 damaging and ensure the safety of the test operators even if mistake occurs.

Figure 4:
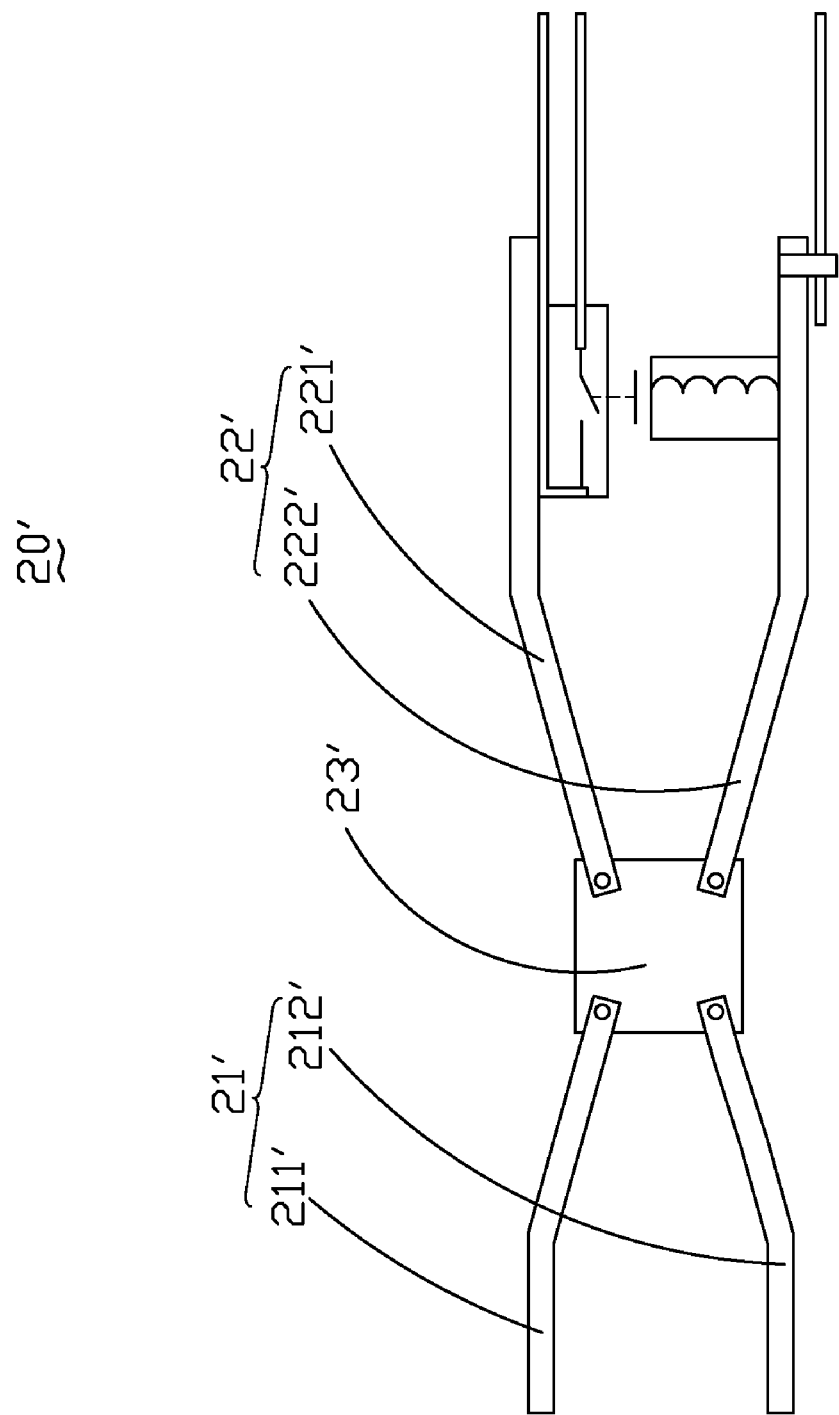
FIG. 4 is a schematic diagram of structure of a fork assembly in accordance with a second exemplary embodiment of the disclosure.
Figure 5:
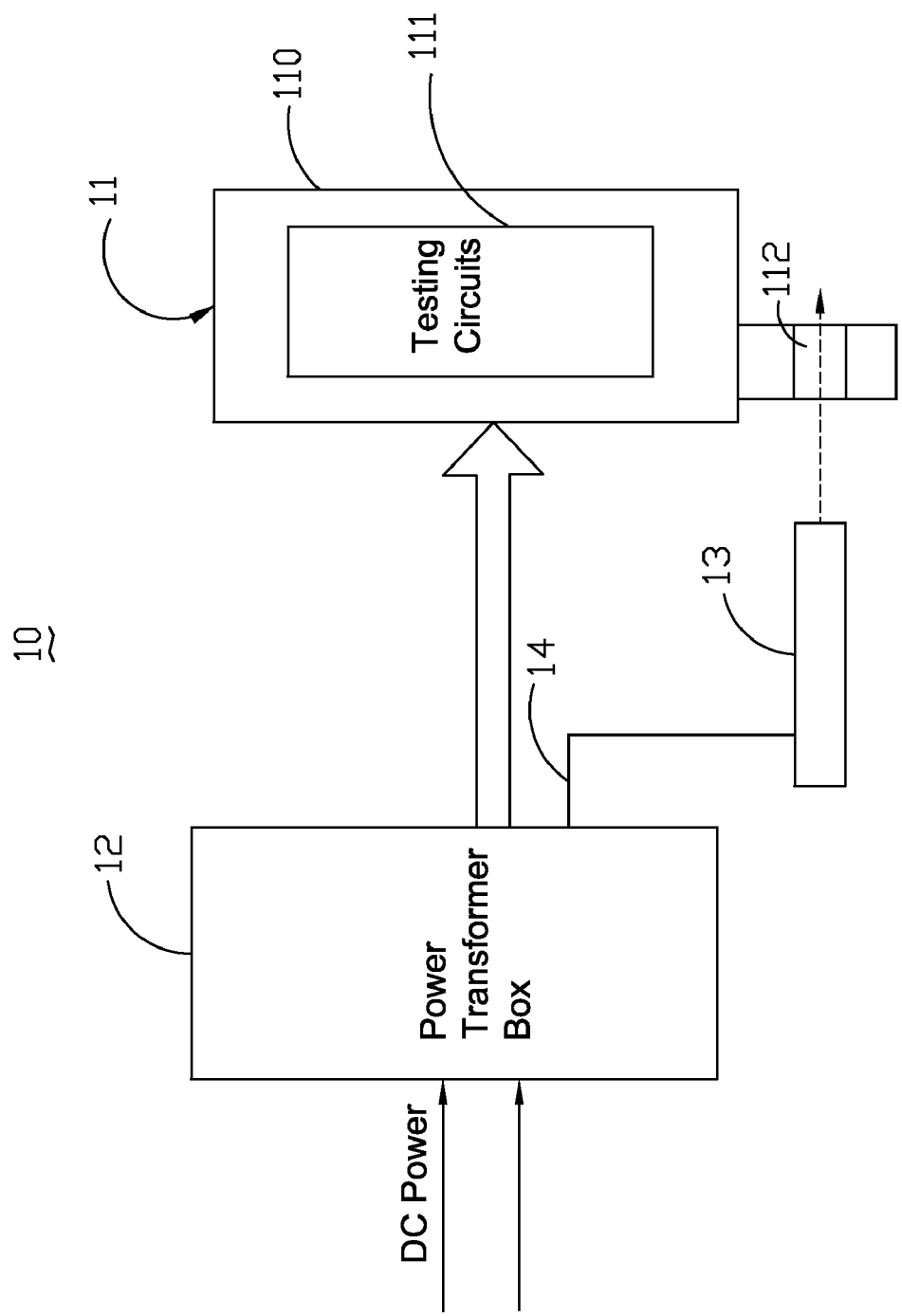
FIG. 5 is a schematic diagram of a commonly used test system.

FIG. 4 is a schematic diagram of structure of a fork assembly 20' in accordance with a second exemplary embodiment of the disclosure. The fork assembly 20' has the same configuration and can perform the same function as the fork assembly 20 shown in FIG. 3, differing only in that one end of each of a first arm 211', a second arm 212', a third arm 221', a fourth arm 222' of the fork assembly 20' is attached to the fixed board 23', at least one of the first arm 211' and the second arm 212' is resilient, and at least one of the third arm 221' and the fourth arm 222' is resilient.

While exemplary embodiments have been described, it should be understood that it has been presented by way of example only and not by way of limitation. The breadth and scope of the disclosure should not be limited by the described exemplary embodiments, but only in accordance with the following claims and their equivalents.

What is claimed is:

1. A test system, comprising:
   a device under test (DUT) comprising an enclosure and one or more tested circuits received in the enclosure, wherein the enclosure defines a socket for grounding;
   a power transformer box to transform direct current (DC) power into suitable electrical signals to test the tested circuits in the DUT, the power transformer box comprising a grounded enclosure; and
   a fork assembly connected to the DC power to control input of the power transformer box, and adapted to be inserted into the socket in the enclosure of the DUT to ensure that the enclosure of the DUT is grounded, the fork assembly comprising:
   a fixation board;
   a ground portion comprising a first arm and a second arm located opposite to the first arm, wherein one end of each of the first and second arms is connected to the fixation board, and a second end of each of the first and second arms is free;
   a trigger portion comprising a third arm and a fourth arm located opposite to the third arm, wherein one end of each of the third and fourth arms is connected to the fixation board;
   a switch fixed on a second end of the third arm, and comprising an always-off contact connected to the DC power in series to control the input of the power transformer box; and
   a resilient element configured on a second end of the fourth arm and corresponding to the always-off contact of the switch;
   wherein the first, second, third and fourth arms are conductively and resiliently connected together to the grounded enclosure of the power transformer box.

2. The test system as claimed in claim 1, wherein one end of each of the first, second, third and fourth arms is fixed on the fixation board, and at least one of the first arm and second arm is resilient, and at least one of the third arm and the fourth arm is resilient.

3. The test system as claimed in claim 1, wherein one end of each of the first, second, third and fourth arms is pivotally connected to the fixation board, and the fork assembly further comprises a first spring shaft and a second spring shaft configured across the fixation board, wherein one end of the first spring shaft is connected to the second arm, and the other end is fixed on the third arm, one end of the second spring shaft is connected to the first arm, and the other end is fixed on the fourth arm.

4. The test system as claimed in claim 1, wherein a maximal distance between the first arm and the second arm is greater than an outer diameter of the hole, and a distance between free ends of the first arm and the second arm is less than the outer diameter of the hole.

5. The test system as claimed in claim 1, wherein a maximal distance between the third arm and the fourth arm is greater than the outer diameter of the hole.

6. The test system as claimed in claim 1, wherein the first, second, third and fourth arms of the fork assembly collectively form a substantial "X" shape configuration.

7. A fork assembly, comprising:
   a fixation board;
   a ground portion comprising a first arm and a second arm located opposite to the first arm, wherein one end of each of the first arm and the second arm is connected to the fixation board, and a second end of each of the first arm and the second arm is free;
   a trigger portion comprising a third arm and a fourth arm located opposite to the third arm,
   wherein one end of each of the third arm and the fourth arm is connected to the fixation board;
   a switch fixed on a second end of the third arm, and comprising an always-off contact; and
   a resilient element configured on a second end of the fourth arm and corresponding to the always-off contact of the switch;
   wherein the first, second, third and fourth arms are conductively and resiliently connected together and insulative from the switch.

8. The fork assembly as claimed in claim 7, wherein one end of each of the first, second, third and fourth arms is fixed on the fixation board, and at least one of the first arm and second arm is resilient, and at least one of the third arm and the fourth arm is resilient.

9. The fork assembly as claimed in claim 7, wherein one end of each of the first, second, third and fourth arms is pivotably connected to the fixation board, and the fork assembly further comprises a first spring shaft and a second spring shaft configured across the fixation board, wherein one end of the first spring shaft is connected to the second arm, and the other end is fixed on the third arm, one end of the second spring shaft is connected to the first arm, and the other end is fixed on the fourth arm.

10. The fork assembly as claimed in claim 7, wherein the first, second, third and fourth arms of the fork assembly collectively form a substantial "X" shape configuration.

* * * * *